(12) United States Patent
Symko et al.

(10) Patent No.: US 6,294,030 B1
(45) Date of Patent: Sep. 25, 2001

(54) FORMATION AND APPLICATIONS OF ALCUFE QUASICRYSTALLINE THIN FILMS

(75) Inventors: Orest G. Symko, Salt Lake City, UT (US); Thierry Klein, Lutherbach (FR); David Kieda, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 08/357,435

(22) Filed: Dec. 15, 1994

(51) Int. Cl.$^7$ .................................................. C22C 21/00

(52) U.S. Cl. .................. 148/415; 148/416; 148/438; 148/439; 420/538; 427/405; 428/650

(58) Field of Search .................... 148/415, 416, 148/438, 439; 420/538; 428/650; 427/405

(56) References Cited

U.S. PATENT DOCUMENTS

| | | | |
|---|---|---|---|
| 4,595,429 | * | 6/1986 | Le Caer et al. ..................... 148/403 |
| 4,710,246 | * | 12/1987 | Le Caer et al. ..................... 148/403 |
| 5,204,191 | * | 4/1993 | Dubois et al. ..................... 420/538 |

OTHER PUBLICATIONS (*) Applicants cited references.*

* cited by examiner

*Primary Examiner*—Sikyin Ip
(74) *Attorney, Agent, or Firm*—TraskBritt

(57) ABSTRACT

Various articles of manufacture, such as electrosurgical scalpels, razor blades, and electronic components, comprise a quasicrystalline AlCuFe alloy film less than about 3000 Å thick, formed by depositing in sequence on a substrate through radio frequency sputtering a stoichiometric amount of each respective alloy material and then annealing those layers to form the film through solid state diffusion.

19 Claims, 4 Drawing Sheets

FORMATION AND APPLICATIONS OF ALCUFE QUASICRYSTALLINE THIN FILMS

BACKGROUND

1. Field

This invention relates to thin metal alloy films which are quasicrystalline or approximately quasicrystalline, as opposed to amorphous or crystalline, in nature. It is particularly directed to a method for making very thin such films from materials having the general formula $Al_aCu_bFe_cX_dI_e$, where X represents one or more optional alloy elements and I represents manufacturing impurities. It is further directed to applications which take advantage of the unique properties of such films.

2. State of the Art

Alloy metal films are well known. Alloys having the general formula $Al_aCu_bFe_cX_dI_e$, where X represents one or more elements selected from the group consisting of V, Mo, Ti, Zr, Nb, Cr, Mn, Ru, Rh, Ni, Mg, W, Si and the rare earth elements, and I represents manufacturing impurities, generally present in an amount of less than two percent of the atoms present, are disclosed, for example, by U.S. Pat. No. 5,204,191. U.S. Pat. Nos. 4,595,429 and 4,710,246 disclose a number of Aluminum-based alloys characterized by amorphous or microcrystalline structures.

An icosahedral phase was observed in 1984 in a rapidly quenched AlMn alloy. Since that time, many experiments have been carried out to clarify the structure and properties of this new ("quasicrystalline") state of condensed matter. Most of the quasicrystalline phases studied have been metastable; however, a few of them have evidenced thermodynamic stability. The AlCuFe alloys, for example, provide pure icosahedral phases of high structural quality and peculiar electronic and magnetic properties. Notably, such alloys are characterized by unusually high electrical resistivity values, which increase as the structural quality of the sample is improved; a very low thermal conductivity; a low density of states at the Fermi level; a strong composition dependence of the resistivity and the Hall coefficient and a diamagnetic susceptibility.

The AlCuFe alloys have typically been prepared either by melt spinning or long term annealing of bulk ingots. Monograins of millimeter size have been produced by these techniques. Recently, films about 10 $\mu$m in thickness have been obtained by cosputtering three elements onto liquid nitrogen cooled substrates and then annealing the resulting films. Binary metastable quasicrystals have also been produced by solid state diffusion of either sputtered or evaporated layers. Decagonal $Al_3Pd$ phases have been obtained by the lateral diffusion of Al islands on a Pd thin film.

SUMMARY OF THE INVENTION

The disclosures of U.S. Pat. Nos. 4,595,429, 4,710,246 and 5,204,191 are each incorporated by reference as a part of this disclosure for their descriptions of alloy systems and compositions. The alloys defined by the incorporated patent disclosures are regarded as generally good candidates for the production of thin films in accordance with the techniques of this invention. The article "*Formation of AlCuFe quasicrystalline thin films by solid state diffusion,*" T. Klein and O. G. Symko, Appl. Phys. Lett. 64 (4), p 431, Jan. 24, 1994, describes work upon which this application is based in part, and is incorporated in this disclosure by reference.

This invention provides an article of manufacture comprising a quasicrystalline metal alloy film less than about 3000 Å thick. While 3000 Å is not regarded as a "critical" boundary, it represents the approximate upper limit of film thickness at which the films of this invention are currently believed to be distinguishable from films of similar composition produced by other means. The film has a composition of the general formula $Al_aCu_bFe_cX_dI_e$, where X represents one or more optional alloy elements and I represents manufacturing impurities. In typical films, a=100-b-c-d-e; 24<b<26; 12<c<13; 0<d<10; and 0<e<3. More preferred film compositions are approximately: a=100-b-c-d-e; 24.4<b<26.0; 12.0<c<13.0; d=0; e=trivial. The film is formed by depositing in sequence on a substrate, by radio frequency sputtering, a stoichiometric amount of each respective constituent material and then annealing the layers, whereby to form the film through solid state diffusion. The substrate may comprise an electrical insulator or a conductor, such as an alloy, and the film may be utilized as a component of an electronic device. The substrate may, alternatively, comprise a wear surface or cutting edge, and the film may be utilized as a protective coating and/or for thermal isolation.

According to this invention, very thin films, typically less than about 3000 Å, ideally less than about 1000 Å thick, are produced by a technique involving depositing "stoichiometric" ratios of selected alloy elements in sequence on an oscillating substrate, and then annealing the deposited layers to produce an alloy having a composition within a quasicrystalline phase. The term "stoichiometric" is used in this disclosure to indicate the presence of atoms of selected elements in a predetermined numerical ratio. Accordingly, layers of the selected alloy elements are deposited in sequence in precise amounts on a suitable substrate. Within practical limits, annealing of those layers will produce an alloy composition reflecting the stoichiometric ratio of the layers. This approach has been found effective to produce very thin films possessing excellent properties for a variety of practical applications. The films of this invention are ideally comprised of ternary stable AlCuFe quasicrystals prepared by the solid state diffusion of Al, Cu, and Fe layers, an exemplary such film being formed from layers of Al, Fe and Cu deposited in sequence in thickness ratios of approximately 7.0/1.0/2.0, respectively, prior to annealing.

While this disclosure emphasizes AlCuFe alloys, the film formation techniques of this invention are regarded as being generally applicable to any alloy composition within a quasicrystalline region of a phase diagram descriptive of any alloy system of interest. The aluminum-rich alloys described by the '429, the '246 and the '191 patents are of primary interest at present because of the interesting properties observed to be characteristic of certain of them.

Practical applications for films produced by this invention include electronic circuits for devices; coatings to reduce friction and wear in machines, bearings, cutting tools and circuits; protection of hard disk surfaces against hard crashes and providing low friction surfaces to devices such as magnetic storage drives and magnetic tape or disc heads. The high hardness and low friction characteristics of quasicrystalline materials are well suited for coatings of cutting surfaces, such as razor blades, surgical blades and knives, generally offering smoother performance with less tear of flesh or other forms of degradation typically encountered in cutting various materials. Such coatings impart non-stick characteristics to the blades in use, and extend their useful lives. Electrosurgical blades coated with a thin film of quasicrystalline AlCuFe material offer superior mechanical and electrical performance, for example, compared to presently-used teflon-coated blades. Similar coatings may also be applied to the critical surfaces of sports equipment, notably skates and skis.

The low thermal conductivity of the films of this invention enables them to function well in a variety of applications. For example, a quasicrystalline coating may function as a heat shield or to maintain a thermal gradient.

Various substrates are practical. Strontium titanate, silicon dioxide, sapphire and steel are exemplary substrates. Very thin films can be fabricated in accordance with this invention, and both the thickness and purity level of the film can be well controlled. The process may be conducted so that film formation takes place by solid state diffusion, without going through a liquid phase. Lower anneal temperatures (600° C. for a particular alloy compared to the 800° C. temperature required for the same alloy in bulk ingot form) are effective. A two-step heat treatment is presently preferred. In the specific case of AlCuFe, the first step is conducted at a relatively lower temperature to form the first-to-form aluminum-rich alloy; i.e. $Al_3Fe$. The second step is conducted at a relatively higher temperature to promote formation of the quasicrystalline phase. Films of certain alloys consist of grains smaller then 0.5 $\mu$m in diameter.

A notable benefit of the formation technique of this invention; i.e., the combination of sputtering and solid state diffusion, is the resulting excellent adherence of the quasicrystalline film to the substrate.

According to this invention, various articles of manufacture, such as electrosurgical scalpels, razor blades, and electronic components, comprise a quasicrystalline AlCuFe alloy film formed by depositing in sequence on a substrate through radio frequency sputtering a stoichiometric amount of each respective alloy material, and then annealing those layers to form the film through solid state diffusion. The film is ideally comprised of ternary stable AlCuFe quasicrystals prepared by the solid state diffusion of Al, Cu, and Fe layers. Layers of Al, Fe and Cu are most preferably deposited in sequence in thickness ratios of 7.0/1.0/2.0, respectively, prior to annealing. Certain articles produced by this invention utilize the film for its thermal isolation properties. Other articles utilize the film to maintain a temperature gradient. In other articles, the substrate may be associated with the cutting edge of a knife, scalpel, razor blade or electrosurgical blade. In still other articles, the substrate is an electrical insulator or conductor, and the film is utilized as a component of an electronic device. Other articles utilize the film as a coating for wear surfaces. In most instances, the film will be less than about 3000 Å thick, ideally, less that about 1000 Å thick.

DESCRIPTION OF THE ILLUSTRATED EMBODIMENTS

Very thin films (<3000 Å) of ternary stable AlCuFe quasicrystals were prepared by the solid state diffusion of Al, Cu, and Fe layers. It can be determined from the Al-rich part of the AlCuFe phase diagram, FIG. 1, that pure icosahedral alloys must have compositions within a narrow range, typically $Al_{100-X-Y}Cu_XFe_Y$, with 24.4<x<26.0 and 12.0<y<13.0. The icosahedral phase is surrounded by many binary and ternary crystalline phases, especially the $\beta$-AlFe (Cu) cubic phase, which is usually present as a contaminating phase in an as-quenched alloy from the icosahedral phase.

EXAMPLE 1

Figure 1:
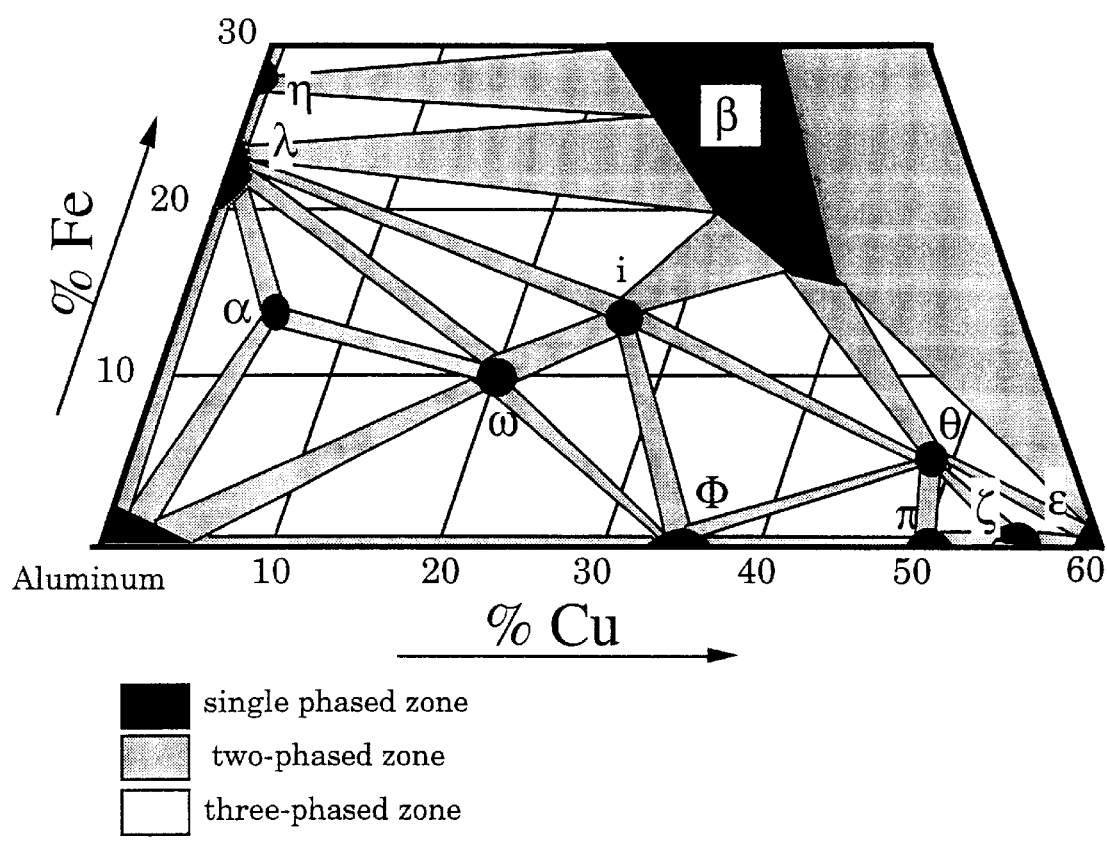
FIG. 1 reproduces the Al-rich region of the AlCuFe phase diagram.

Al, Fe, and Cu layers were sputtered consecutively at room temperature on $SrTiO_3$ substrates, using an rf magnetron sputterinq system with a base pressure of about $1 \times IO^{-7}$ Torr. High purity argon (2–3 mTorr) was used as a sputtering gas. The rf power supply was of 200 Watts capacity. The distance between the targets of each element and the sample holder was about 2 in., leading to sputtering rates of about 10, 15, and 5 ÅÅ/s for Al, Cu, and Fe, respectively. To ensure a good thickness homogeneity, the sample holder was oscillated at 0.5 Hz below the target. These oscillations were considered to be important for control of sample composition, because, as shown by FIG. 1, the quasicrystalline phase can only be obtained within a very narrow composition range. The $SrTiO_3$ substrates were stuck to the sample holder with a small amount of grease. The thickness of the different layers was controlled through use of a vibrating quartz thickness monitor calibrated with pure elements. The films were then subsequently annealed in a quartz tube under high vacuum ($10_{-6}$ Torr), first at 350° C. overnight and then at 600° C. for 2 hours.

It was known that the electrical resistivity of the alloys depends upon the nominal composition and the structural quality of the sample being maximal for $Al_{62.5}Cu_{25}Fe_{12.5}$. This peculiar composition corresponds to a 7.0/2.0/1.0 thickness ratio for the Al, Cu and Fe layers, respectively. Accordingly, a 2100-Å-thick Al layer, followed by a 300 Å Fe layer and a 600 Å Cu layer were sputtered on the substrate. To compensate for small calibration errors of the thickness monitor, several samples were prepared, with the measured thicknesses of the Cu and Fe layers varying by 10 Å.

As a first characterization, electrical resistivity measurements were made of the films using a four-probe Van der Pauw technique. The structural quality of the films of highest resistivity was then checked using a low angle x-ray diffraction technique. Scanning electron microscope images were also performed to check the quality of the films.

After the first annealing treatment (350° C. overnight), the copper color of the top layer completely disappeared, indicating that the different elements had mixed together. However, the resistivity values of these films were only a few tens of $\mu\Omega$ cm, suggesting that they were significantly contaminated by crystalline phases. A further annealing at 600° C. provided several samples with resistivity values ranging from 2000 to 3000 $\mu\Omega$ cm for 600 Å<Cu layer<640 Å and 280 Å<Fe layer <300 Å on the Al layer. Outside this range, the resistivity rapidly dropped by an order of magnitude, emphasizing the strong dependence of the electrical properties on the purity of the sample. Significantly, the resistivity of the films also decreased when annealed at above 700° C., whereas in bulk samples, an annealing temperature of at least 800° C. was necessary to produce pure quasicrystalline phase of high structural quality.

Figure 2:
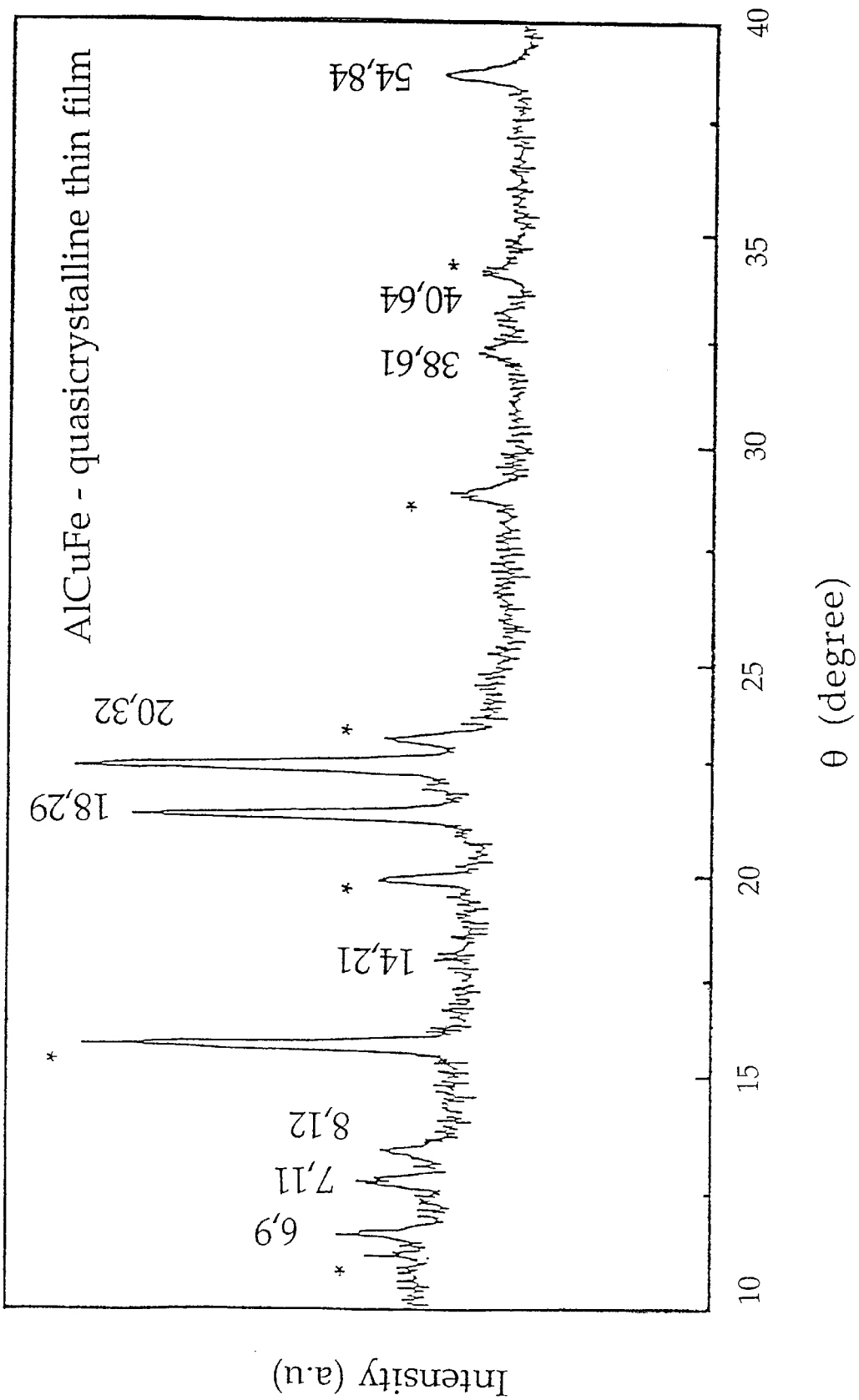
FIG. 2 is a low angle x-ray diffraction pattern of an AlCuFe thin film of the invention.
Figure 3:
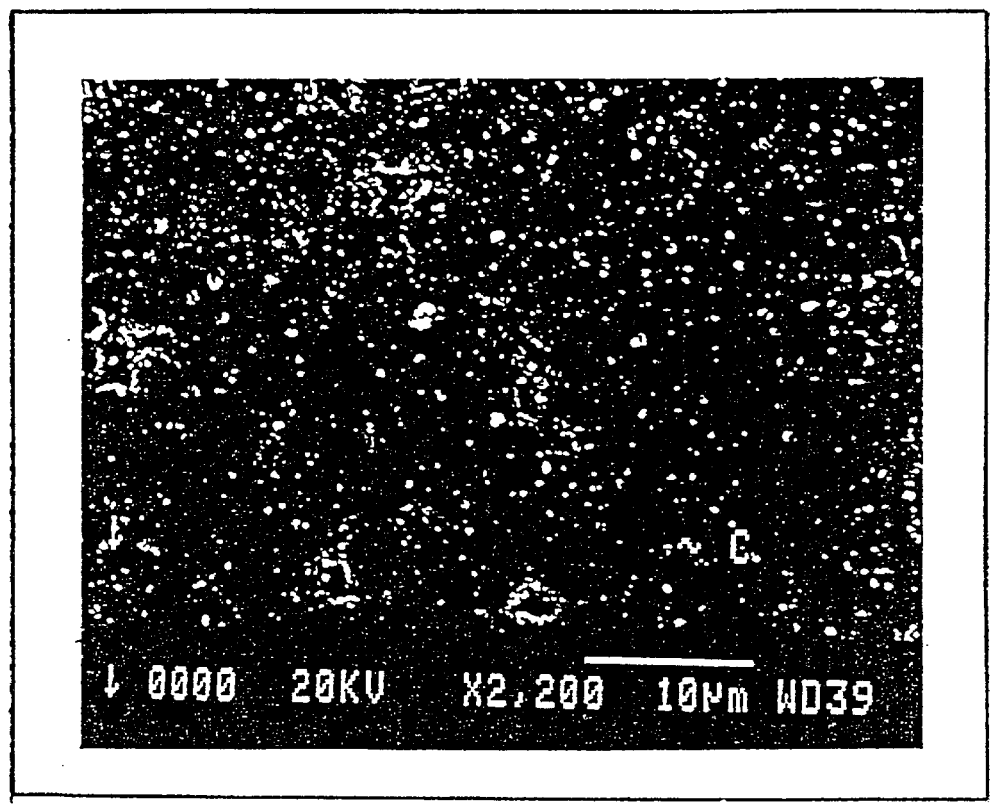
FIG. 3 illustrates a scanning electron micrograph of the AlCuFe thin film of FIG. 2, showing the polycrystalline structure of the film.

FIG. 2 presents the x-ray diffraction pattern of one of the quasicrystalline films prepared for Example 1. Except for a very small peak present in this case between the two main icosahedral peaks, all the peaks are attributable to either the icosahedral phase or the $SrTiO_3$ substrate. From this x-ray diffraction pattern, the direct lattice parameter of the film was estimated to be about 6.31 Å, in good agreement with results previously found in bulk ingot material of the same composition. The scanning electron microscope picture of this film presented in FIG. 3 shows that the poly-crystalline structure of the film consists of small quasicrystalline grains about 1 μm or less in diameter. The film is also shown to be approximately homogeneous.

EXAMPLE 2

Electrosurgical blades were coated with a thin film of quasicrystalline AlCuFe by radio frequency sputtering and annealing as described by Example 1. A 3000 Å thick film of $Al_{62.5}Cu_{25}Fe_{12.5}$ alloy was formed separately on each side of the blades. Excellent adherence to the blade substrate was noted.

The thus-coated blades were compared to conventional electrosurgical blades coated with Teflon operated at the same electrical conditions (a power level of 40 watts). After about two cuts, the Teflon blades developed a high resistance to cutting, creating visible chars on and sticking of the flesh. Damage to the Teflon coating also became evident. By contrast, after six cuts, there were no visible signs of deterioration to the blades of this invention, and cut flesh did not stick to the blades.

X-ray diffraction patterns and transport measurements performed on films of the same composition fabricated the same way confirmed the quasicrystalline structure of these films. The films on the blades were estimated to be at least 90% quasicrystalline. The mechanical characteristics (strength and low friction) of the films on the blades are consistent with the observed behavior of quasicrystalline materials.

EXAMPLE 3

Figure 4:
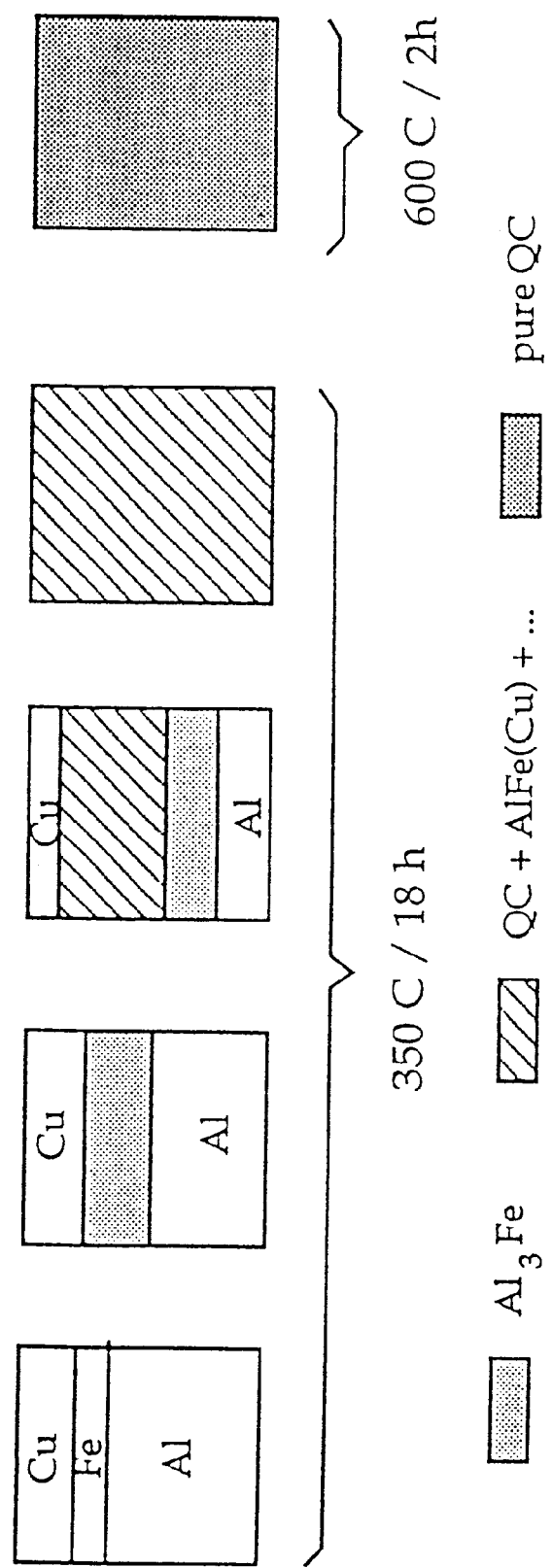
FIG. 4 is a schematic representation of a typical sequence of steps useful for the formation of a pure quasicrystalline thin film in accordance with the invention.

FIG. 4 illustrates the sequence of steps involved in a preferred method of formation of the quasicrystalline film. Significantly, it is feasible to obtain pure icosahedral films by annealing only three discrete elemental layers. Previous formation methods have relied upon alternating very thin layers of the elements of even two-element systems to obtain pure icosahedral films. The sequence in which the different layers are sputtered was found to be important in the AlCuFe system. Attempts to obtain pure quasicrystalline film using an Al—Cu—Fe sequence were not successful. This result is understood to suggest an important role played by the $Al_3Fe$ intermediate compound, which is avoided by sputtering the elements in an inappropriate sequence; e.g., Al—Cu—Fe.

EXAMPLE 4

Films of approximately 3000 Å were deposited on the side surfaces of razor blades following the procedure of Example 1. Grains in the film were less than 0.5 μm in diameter. The coated blades were found to offer a low friction surface against skin. Compared to conventional Teflon-coated razor blades, the blades of this example had better durability, were less bulky and lighter in weight and were more resistant to oxidation.

What is claimed is:

1. An article of manufacture, comprising:
    a quasicrystalline metal alloy film less than about 3000 Å thick, said film having a composition of a general formula $Al_aCu_bFe_cX_dI_e$, where X represents one or more optional alloy elements and I represents manufacturing impurities, and where a=100-b-c-d-e; 24<b<26; 12<c <13; 0<d<10; and 0<e<3.

2. An article of manufacture according to claim 1, wherein said optional alloy elements are selected from the group consisting of V, Mo, Ti, Zr, Nb, Cr, Mn, Ru, Rh, Ni, Mg, W, Si and the rare earth elements.

3. An article of manufacture according to claim 1, wherein said film is formed by depositing in sequence on a substrate through radio frequency sputtering a stoichiometric amount of each respective alloy material and then annealing said whereby to form said film through solid state diffusion.

4. An article of manufacture according to claim 3, wherein said substrate includes a cutting edge.

5. An article of manufacture according to claim 4, wherein said cutting edge comprises a knife, scalpel, razor blade or electrosurgical blade.

6. An article of manufacture according to claim 1, wherein the composition of said film is approximately: a=100-b-c-d-e; 24.4<b<26.0; 12.0<c<13.0; d=0; e=trivial.

7. An article of manufacture according to claim 6, wherein said film is formed by depositing in sequence on a substrate through radio frequency sputtering a stoichiometric amount of each respective alloy material and then annealing said whereby to form said film through solid state diffusion.

8. An article of manufacture according to claim 7, wherein said substrate includes a cutting edge.

9. An article of manufacture according to claim 8, wherein said cutting edge comprises a knife, scalpel, razor blade or electrosurgical blade.

10. An article of manufacture according to claim 7, wherein said substrate is an electrical insulator, and said film is utilized as a component of an electronic device.

11. An article of manufacture, comprising:
    a quasicrystalline AlCuFe alloy film less than about 3000 Å thick, formed by depositing in sequence on a substrate through radio frequency sputtering a stoichiometric amount of each respective alloy material and then annealing said layers, whereby to form said film through solid state diffusion.

12. An article of manufacture according to claim 11, wherein said substrate includes a cutting edge.

13. An article of manufacture according to claim 12, wherein said cutting edge comprises a knife, scalpel, razor blade or electrosurgical blade.

14. An article of manufacture according to claim 11, wherein composition of said film is approximately: a=100-b-c-d-e; 24.4<b<26.0; 12.0 <c<13.0; d=0; e=trivial.

15. An article of manufacture according to claim 14, wherein said substrate includes a cutting edge.

16. An article of manufacture according to claim 15, wherein said cutting edge comprises a knife, scalpel, razor blade or electrosurgical blade.

17. An article of manufacture according to claim 15, wherein said substrate is an electrical insulator, and said film is utilized as a component of an electronic device.

18. An article of manufacture according to claim 11, wherein said film is comprised of ternary stable AlCuFe quasicrystals prepared by the solid state diffusion of Al, Cu, and Fe layers.

19. An article of manufacture according to claim 18, wherein said layers of Al, Fe and Cu are deposited in sequence in thickness ratios of 7.0/1.0/2.0, respectively, prior to annealing.

* * * * *

UNITED STATES PATENT AND TRADEMARK OFFICE
CERTIFICATE OF CORRECTION

PATENT NO.     : 6,294,030 B1                                              Page 1 of 1
DATED          : April 16, 2001
INVENTOR(S)    : Orest G. Symko, Thierry Klein and David Kieda It is certified that error appears in the above-identified patent and that said Letters Patent is hereby corrected as shown below:

Column 3,
Line 49, delete "that" add -- than --

Column 4,
Line 15, delete "sputterinq" add -- sputtering --
Line 15, delete "1xIO-$^7$" add -- $1x10^{-7}$ --
Line 20, delete "ÅÅ/s" add -- ÅA/s --
Line 31, delete "10$_{-6}$" add -- $10^{-6}$ --

Column 6,
Lines 12 and 25, after "annealing said" insert -- layers, --

Signed and Sealed this

Twenty-fourth Day of September, 2002

Attest:

Attesting Officer

JAMES E. ROGAN
Director of the United States Patent and Trademark Office